(12) United States Patent
Oyamada

(10) Patent No.: US 6,359,490 B1
(45) Date of Patent: Mar. 19, 2002

(54) CLAMPING CIRCUIT AND INTERFACE CIRCUIT THEREFOR

(75) Inventor: Seisei Oyamada, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/594,309

(22) Filed: Jun. 15, 2000

(30) Foreign Application Priority Data

Jun. 15, 1999 (JP) .......................................... 11-168164

(51) Int. Cl.[7] .................................................. H03K 5/08
(52) U.S. Cl. ........................ 327/313; 327/314; 327/333
(58) Field of Search ................................ 327/309, 313, 327/314, 320, 325, 328, 333; 326/60, 80, 81

(56) References Cited

U.S. PATENT DOCUMENTS 5,237,213 A * 8/1993 Tanoi .......................... 327/379
5,323,071 A * 6/1994 Hirayama ..................... 326/68
5,583,460 A * 12/1996 Dohi et al. .................. 327/313
5,929,688 A * 7/1999 Ueno et al. .................. 327/333

* cited by examiner

Primary Examiner—Terry D. Cunningham
(74) Attorney, Agent, or Firm—William B. Kempler; Frederick J. Telecky, Jr.

(57) ABSTRACT

The purpose of the present invention is to provide a clamping circuit which has a simple circuit design, with which the clamping voltage range can be easily adjusted, and which can operate at reduced power consumption, as well as interface circuit that makes use of the clamping circuit. NMOS transistor NT1 and diode D1 are connected in series between the feed line of power source voltage $V_{cc}$ and input terminal $T_{in}$, and diode D2 and PMOS transistor PT1 are connected in series between input terminal $T_{in}$ and ground voltage GND. The divider voltages $V_{ND1}$, and $V_{ND2}$ obtained from resistive elements R1, R2 and R3 connected in series are applied to the control terminals of transistors NT1 and PT1, respectively. Also, transistor NT2 is connected in parallel to resistive element R2. By means of control voltage $V_B$ input to the control terminal of NT2, the divider voltages are controlled, and the range of the clamping voltage can be controlled. By connecting the clamping circuit to the input side of each buffer on the transmission line, it is possible to omit the terminal resistances of the transmission line.

10 Claims, 3 Drawing Sheets

CLAMPING CIRCUIT AND INTERFACE CIRCUIT THEREFOR

FIELD OF THE INVENTION

The present invention pertains to a clamping circuit for restricting the voltage of the input signal to a prescribed range, and interface circuit that makes use of said clamping circuit.

BACKGROUND OF THE INVENTION

In the prior art, in order to increase the ESD (Electrostatic Discharge) voltage rating and to suppress the reflected noise for the interior of IC, wiring of PCB (Printed Circuit Board), etc., a diode clamping circuit or Schottky barrier diode clamping circuit is used. FIG. 7 is a diagram illustrating an example of the Schottky barrier diode clamping circuit.

As shown in FIG. 7, this clamping circuit is composed of Schottky barrier diodes (referred to as diodes hereinafter) D1 and D2 connected in series between the supply line of power source voltage $V_{cc}$ and ground voltage GND.

The anode of diode D1 is connected to input terminal $T_{in}$, and its cathode is connected to the supply line of power source voltage $V_{cc}$. The anode of diode D2 is grounded, and its cathode is connected to input terminal $T_{in}$.

In this case, if the forward rise voltage of diode D1 is $V_{D1}$, and signal voltage $V_{in}$ of input terminal $T_{in}$ satisfies the condition $V_{in} > V_{cc} + V_{D1}$, diode D1 becomes conductive, voltage $V_{in}$ of input terminal $T_{in}$ is clamped to a level above power source voltage $V_{cc}$ by the conductive voltage of diode D1.

If the forward rise voltage of diode D2 is VD2, and signal voltage $V_{in}$ of input terminal $T_{in}$ satisfies the condition $V_{in} < VD2$, diode D2 becomes conductive, and voltage $V_{in}$ of input terminal $T_{in}$ is clamped to a level below ground voltage GND by the conductive voltage of diode D1.

FIG. 8 is a diagram illustrating the clamping characteristics of the clamping circuit shown in FIG. 7. As shown in the figure, this clamping circuit may be connected to the terminal of a signal transmission line to clamp the terminal voltage of the signal transmission line from a voltage slightly below ground voltage GND to a voltage slightly above power source voltage $V_{cc}$. In this way, it is possible to prevent reflection of the signal at the terminal of the transmission line and to inhibit generation of reflected noise on the transmission line.

However, in the aforementioned conventional clamping circuit, the range of the clamping voltage depends on power source voltage $V_{cc}$ and the conductive voltage of the diode used in the clamping circuit, and it is impossible to set the clamping voltage at will. Also, due to the conductive voltage of the diode, the clamping voltage range shifts a little from power source voltage $V_{cc}$ and ground voltage GND. For example, when voltage $V_{in}$ at input terminal $T_{in}$ is to be clamped between ground voltage GND and power source voltage $V_{cc}$, voltages $V_{c1}$ and $V_{c2}$ should be supplied to the cathode of diode D1 and the anode of diode D2,respectively, as shown in FIG. 9. Consequently, voltage sources for generating said voltages $V_{c1}$ and $V_{c2}$ must be arranged separately. This is undesirable for the terminal circuit which should have a simple circuit configuration.

The purpose of the present invention is to solve the aforementioned problems of the conventional technology by providing a clamping circuit which has a simple circuit configuration and which can set the clamping voltage range at will, and an interface circuit that makes use of said clamping circuit.

SUMMARY OF THE INVENTION

In order to realize the aforementioned purpose, the present invention provides a type of clamping circuit characterized by the following facts: the clamping circuit has a first circuit containing a first transistor and a first diode electrically connected in series between the input terminal and the fit voltage feed line, and a first voltage feed terminal for feeding the first voltage to the control terminal of said first transistor; when the voltage between said first voltage feed terminal and said input terminal reaches a prescribed level, said first transistor becomes conductive and the voltage of said input terminal is clamped.

Also, the clamping circuit of the present invention is characterized by the following facts: the clamping circuit has a first circuit containing a first transistor and a first diode electrically connected in series between said input terminal and the first voltage feed line, a first voltage feed terminal for feeding the first voltage to the control terminal of said first transistor, a second circuit containing a second transistor and a second diode electrically connected in series between said input terminal and the second voltage feed line, and a second voltage feed terminal for feeding the second voltage to the control terminal of said second transistor; when the voltage between said first voltage feed terminal and said input terminal or the voltage between said second voltage feed terminal and said input terminal reaches a prescribed level, said first or second transistor becomes conductive and the voltage of said input terminal is clamped.

Also, the clamping circuit in the present invention is preferably characterized by the following facts: it has a first, a second and a third resistive element connected in series between said first voltage feed line and said second voltage feed line; the connection point between said first resistive element and said second resistive element forms said first voltage feed terminal; and the connection point between said second resistive element and said third resistive element forms said second voltage feed terminal.

Also, the clamping circuit of the present invention is preferably characterized by the following facts: the cathode of said first diode is connected to said input terminal; said first transistor is connected between the anode of said first diode and said first voltage feed line; the anode of said second diode is connected to said input terminal; said second transistor is connected between the cathode of said second diode and said second voltage feed line; the power source voltage is fed to said first voltage feed line; and the ground voltage is fed to said second voltage feed line.

The interface circuit of the present invention is characterized by the following facts; the interface circuit has a signal line, a drive circuit which has its output terminal connected to said signal line and is for driving said signal line to the prescribed voltage, an input circuit which has its input terminal connected to said signal line and operates corresponding to the voltage of said signal line, and a clamping circuit connected to the input terminal of said input circuit.

REFERENCE NUMERALS AND SYMBOLS AS SHOWN IN THE DRAWINGS

| | |
|---|---|
| NT1,NT2 | NMOS transistors |
| PT1 | PMOS transistors |
| R1,R2, R3, R10, R12 | Resistive elements |
| D1,D2 | Diodes |
| DRV1,DRV2 | Drivers |
| BUF1,BUF2,BUF3,BUF4,BUF5 | Buffers |
| TL | Signal transmission line |
| CLP1, CLP2, CLP3, CLP4,CLP5 | Clamping circuit |
| $V_{CC}$ | Power source voltage |
| GND | Ground potential |

DESCRIPTION OF THE EMBODIMENTS

Figure 1:
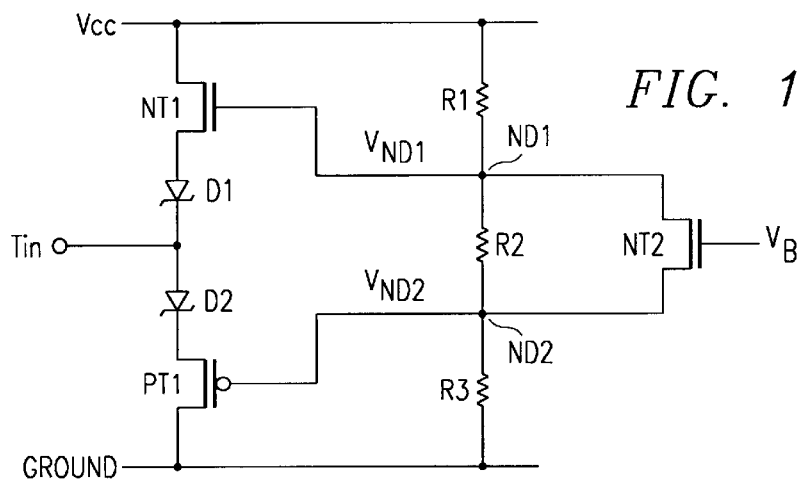
FIG. 1 is a circuit diagram illustrating an embodiment of the clamping circuit of the present invention.

FIG. 1 is a circuit diagram illustrating an embodiment of the clamping circuit of the present invention.

As shown in the figure, the clamping circuit of this embodiment is composed of diodes D1, D2, n-channel MOS transistors (referred to as NMOS transistors hereinafter) NT1, NT2, p-channel MOS transistor (referred to as PMOS transistor hereinafter) PT1, and resistive elements R1, R2 and R3. Here, diodes D1 and D2 may be either pn junction diodes or Schottky barrier diodes. In the clamping circuit shown in FIG. 1, the clamping circuit uses Schottky barrier diodes.

Resistive elements R1, R2 and R3 are connected in series between the feed line of power source voltage $V_{cc}$ and ground voltage GND. The connection point of resistive elements R1 and R2 forms node ND1, and the connection point of resistive elements R2 and R3 forms node ND2.

NMOS transistor NT1, diodes D1, D2, and PMOS transistor PT1 are connected in series between the feed line of power source voltage $V_{cc}$ and ground voltage GND. The drain of NMOS transistor NT1 is connected to the feed line of power source voltage $V_{cc}$, and its gate is connected to node ND1. The anode of diode D1 is connected to the source of NMOS transistor NT1, and its cathode is connected to input terminal $T_{in}$. The anode of diode D2 is connected to input terminal $T_{in}$, and its cathode is connected to the source of PMOS transistor PT1. The gate of PMOS transistor PT1 is connected to node ND2, and its drain is grounded.

Also, the drain of NMOS transistor NT2 is connected to node ND1, its source is connected to nide ND2, and its gate is connected to the input terminal of control voltage $V_B$.

For the clamping circuit having the aforementioned configuration, when the level of the signal input to input terminal $T_{in}$ is outside the prescribed range, the input signal will be clamped. In the following, the operation of the clamping circuit of this embodiment will be explained.

First, the case when transistor NT2 is kept in the OFF state due to control voltage $V_B$ applied to the gate of NMOS transistor NT2 will be considered. Here, the resistance between the drain and source of transistor NT2 is high, and its influence can be ignored. Consequently, voltages $V_{ND1}$ and $V_{ND2}$ at nodes ND1 and ND2 become the divider voltages of resistive elements R1, R2 and R3, and they thus depend on the resistance values of these resistive elements. For example, if power source voltage $V_{cc}$ is 3 V, and resistive elements R1, R2 and R3 have the same resistance value, voltage $V_{ND1}$ of node ND1 becomes 2 V, and voltage $V_{ND2}$ of node ND2 becomes 1 V.

If the voltage between the gate and source of NMOS transistor NT1 is $V_{gsn}$, and the forward rise voltage of diode D1 is $V_{D1}$, when voltage $V_{in}$ of the input signal at input terminal $T_{in}$ goes below ($V_{ND1}-V_{gsn}-V_{D1}$), NMOS transistor NT1 becomes conductive, and input terminal $T_{in}$ is clamped to ($V_{ND1}-V_{gsn}-V_{D1}$)

On the other hand, if the voltage between the gate and source of PMOS transistor PT1 is $V_{gsp}$ and the forward rise voltage of diode D2 is VD2, voltage $V_{in}$ of the input signal at input terminal $T_{in}$ goes above ($V_{ND2}+V_{gsp}$+VD2), PMOS transistor PT1 becomes conductive, and input terminal $T_{in}$ is clamped to ($V_{ND2}+V_{gsp}$+VD2).

The clamping voltages can found with the following equations.

[Equation 1]

$$C_{CL1}=V_{ND1}-V_{gsn}-V_{D1} \quad (1)$$

[Equation 2]

$$C_{CL2}=V_{ND2}+V_{gsn}-V_{D2} \quad (2)$$

Here, clamping voltages $V_{CL1}$ and $V_{CL2}$ are the upper clamping voltage and lower clamping voltages, respectively, of the clamping circuit shown in FIG. 1. When signal voltage $V_{in}$ at input terminal $T_{in}$ satisfies the relationship of ($V_{CL1}<V_{in}<V_{CL2}$), both NMOS transistor NT1 and PMOS transistor PT1 in the clamping circuit become nonconductive and input terminal $T_{in}$ goes to the high-impedance state. When input signal voltage $V_{in}$ is at $V_{CL1}$ or lower, NMOS transistor NT1 becomes conductive, and the voltage at input terminal $T_{in}$ is clamped to $V_{CL1}$. On the other hand, when input signal voltage $V_{in}$ is at $V_{CL2}$ or higher, PMOS transistor PT1 turns ON, and input terminal $T_{in}$ is clamped to $V_{CL2}$.

As an example, if $V_{gsn}$=1 V, $V_{gsp}$=1.3 V, and $V_{D1}=V_{D2}$= 0.2 V, according to equations (1) and (2), one has $V_{CL1}$=0.7 V and $V_{CL2}$=2.6 V. When input signal voltage $V_{in}$ goes outside the range 0.7 to 2.6 V, in the clamping circuit, NMOS transistor NT1 or PMOS transistor PT1 becomes conductive, and input signal voltage $V_{in}$ is clamped.

In the following, the control function of control voltage $V_B$ input to the gate of NMOS transistor NT2 will be explained.

The conductive/nonconductive state of NMOS transistor NT2 is controlled corresponding to the level of control voltage $V_B$. In addition, when NMOS transistor NT2 is in the conductive state, the resistance between the drain and source of NMOS transistor NT2, that is, the so-called On-resistance, varies corresponding to the level of control voltage $V_B$.

In the clamping circuit shown in FIG. 1, when the level of control voltage $V_B$ exceeds a prescribed level, NMOS transistor NT2 turns ON. When the level of control voltage $V_B$ rises further, the On-resistance of NMOS transistor NT2 decreases.

The On-resistance of NMOS transistor NT2 is connection parallel with resistive element R2. When the On-resistance of NMOS transistor NT2 decreases, the resistance between node ND1 and node ND2 decreases. As a result, voltage $V_{ND1}$ of node ND1 decreases. On the other hand, voltage $V_{ND2}$ of node ND2 rises.

According to equation (1), when voltage $V_{ND1}$ of node ND1 decreases, lower clamping voltage $V_{CL1}$ decreases. According to equation (2), as voltage $V_{ND2}$ of node ND2 rises, upper clamping voltage $V_{CL2}$ rises. That is, the clamping voltage range of input signal voltage $V_{in}$ increases.

Figure 2A:
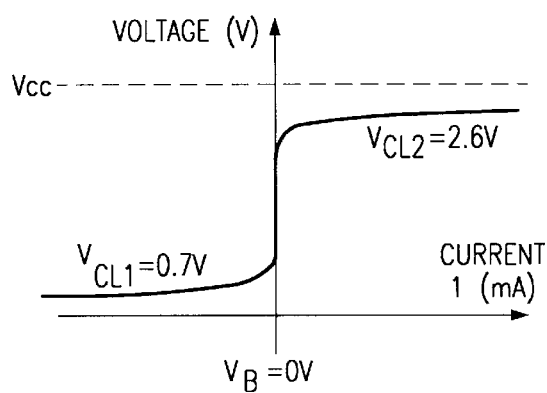
FIGS. 2a and 2b are diagrams illustrating the clamping voltage range of the clamping circuit shown in FIG. 1.
Figure 2B:
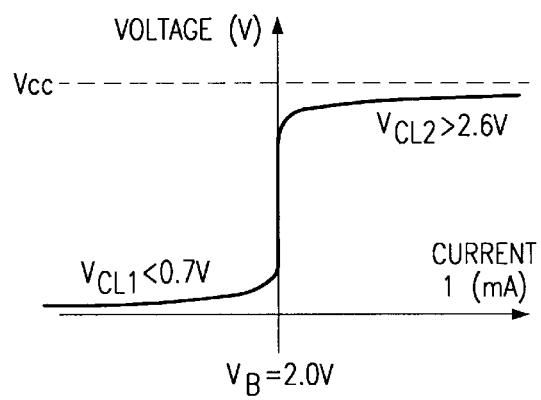

FIGS. 2(a) and (b) illustrate the change in the clamping voltage range by controlling control voltage $V_B$ applied to the gate of NMOS transistor NT2. FIG. [2](a) illustrates the range of the clamping voltage when control voltage $V_B$ is 0 V and NMOS transistor NT2 is in the nonconductive state. In this case, in the aforementioned example, upper clamping voltage $V_{CL2}$ is 2.6 V, and lower clamping voltage $V_{CL1}$ is 0.7 V. FIG. [2](b) illustrates the range of the clamping voltage in the case when control voltage $V_B$ is set at a relatively high voltage, and NMOS transistor NT2 is in the conductive state. In this case, for example, when control voltage $V_B$ is 2.0 V, NMOS transistor NT2 is ON, lower clamping voltage $V_{CL1}$ decreases while upper clamping voltage $V_{CL2}$ rises. Consequently, the clamping voltage range becomes wider than that when control voltage $V_B$ is 0 V.

As explained above, for the clamping circuit in this embodiment, by adjusting the level of control voltage $V_B$ applied to the gate of NMOS transistor NT2, the range of the clamping voltage can be controlled, and flexible clamping characteristics can be obtained by controlling a single voltage.

Also, in the clamping circuit shown in FIG. 1, only one section of diode D1 is connected between the drain of NMOS transistor NT1 and input terminal $T_{in}$. However, it is also possible to make use of multiple diode sections connected in tandem. Similarly, one may also use multiple diode sections connected in tandem between input terminal $T_{in}$ and the source of PMOS transistor PT1.

Also, NMOS transistor NT2 for controlling voltages $V_{ND1}$ and $V_{ND2}$ at nodes ND1 and ND2, respectively, may be replaced with a PMOS transistor.

In the following, more specific working examples of the clamping circuit in this embodiment will be explained.

First, an example of the interface circuit having a conventional CMOS driver and a resistance type terminal circuit will be explained with reference to FIG. 3. As shown in the figure, driver DRV1 for driving signal transmission line TL is e.g., a CMOS driver. On the terminal side of transmission line TL, a terminal circuit made of resistive elements R10 and R12, that is, the so-called Thevenin's terminal circuit, is connected. In this terminal circuit, resistive elements R10 and R12 are connected in series between the teed line of power source voltage $V_{cc}$ and ground voltage GND. The connection point between resistive elements R10 and R12 is connected to the terminal of transmission line TL.

Figure 3:
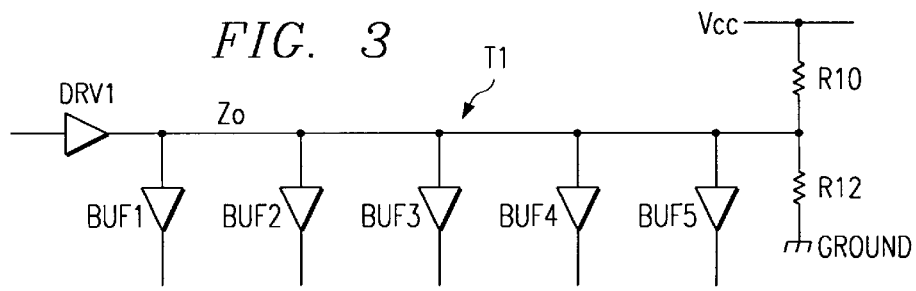
FIG. 3 is a circuit diagram illustrating an example of the interface circuit using a CMOS driver and terminal resistance.

In the example shown in FIG. 3, the output of driver DRV1 is sent through transmission line TL to buffers BUF1, BUF2, . . . BUF5. In this interface circuit, resistive elements are used to make the terminal so as to increase the speed of signal transmission and to prevent noise caused by reflection at the terminal. As shown in FIG. 3, terminal resistive elements R10 and R12 are connected in series between power source voltage $V_{cc}$ and ground voltage GND. The values of resistive elements R10 and R12 are set corresponding to the characteristic impedance $Z_0$ of transmission line TL. The nominal value for the characteristic impedance of a conventional signal transmission line is usually 50, 75, or 100 Ω. The values of terminal resistive elements R10 and R12 are also selected correspondingly low. Consequently, in the terminal circuit shown in FIG. 3, a large bias current always flows through resistive elements R10 and R12, leading to wasted power.

Figure 4:
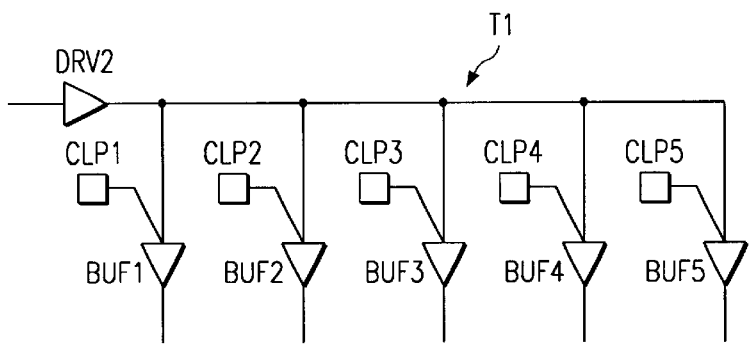
FIG. 4 is a circuit diagram illustrating an example of the interface circuit using ULTTL driver and clamping circuit.

FIG. 4 is a diagram illustrating an example of the interface circuit using the clamping circuit of the present invention. In this interface circuit, instead of CMOS driver DRV1 of FIG. 3, ULTTL driver DRV2 is used. The output of driver DRV2 is sent through transmission line TL to buffers BUFL, BUF2, . . . BUF5. In the terminal of the transmission line, the terminal circuit made of resistive elements shown in FIG. 3 is not used. Instead, clamping circuits CLP1, CLP2, . . . CLP5 are connected to the input terminals of buffers BUF1, BUF2, . . . BUF5. In this case, clamping circuits CLP1, CLP2, . . . CLP5 have the same configuration as that for the clamping circuit shown in FIG. 1.

In the interface circuit shown in FIG. 4, since there is no terminal circuit made of resistive elements, there is no wasteful power loss due to the bias current flowing in the resistive elements. By means of clamping circuits CLP1, CLP2, . . . CLP5 set at the input terminals of the various buffers, the high voltage that would take place due to signal reflection on transmission line TL is clamped. That is, it is possible to prevent reflection of signal on transmission line TL, and it is possible to inhibit reflected noise in the interface circuit.

Figure 5A:
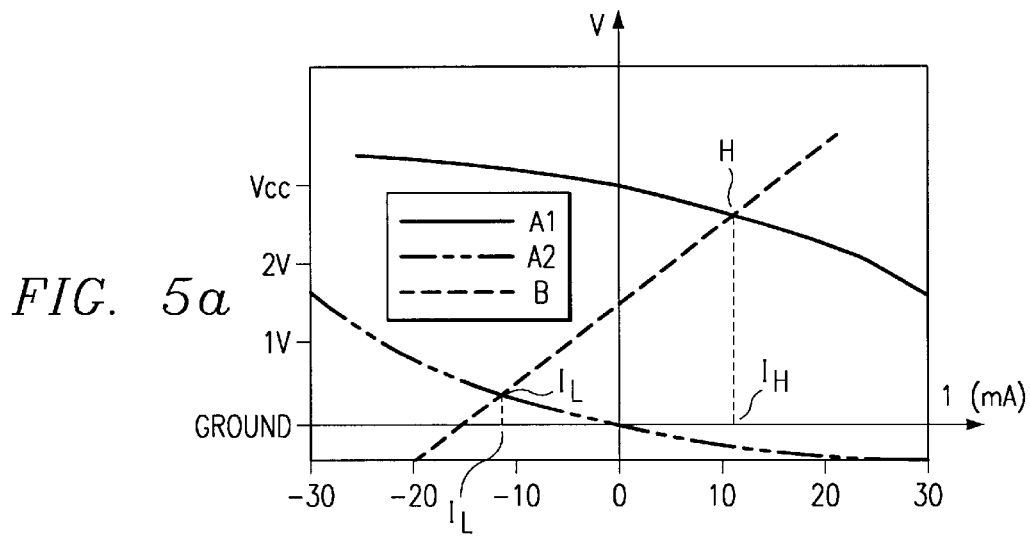
FIGS. 5a and 5b are diagrams illustrating the current in the interface circuit.

FIGS. 5(a) and (b) illustrate the currents of the terminal circuit made up of CMOS driver DRV1 and terminal resistors shown in FIG. 3 and the terminal circuit made of ULTTL driver DRV2 and clamping circuit shown in FIG. 4.

In FIG. 5(a), A1 and A2 represent the output impedance characteristics when the output of CMOS driver DRV1 is at the high level and low level, respectively, and B represents the impedance of the terminal resistive elements. In this case, for example, the power source voltage $V_{cc}$ is 3 V, and the values of resistive elements R10 and R12 are both 200 Ω. In this case, terminal resistance value R, that is, the parallel resistance value of resistive elements R10 and R12, is 100 Ω.

As shown in FIG. 5(a), when the output of CMOS driver DRV1 is at the high level, voltage V of transmission line TL becomes stable at the intersection H of output impedance characteristic curve A1 at the high level and impedance characteristic curve B of the terminal resistance. In this case, current $I_H$ is fed from CMOS driver DRV1 to transmission line TL.

On the other hand, when the output of CMOS driver DRV1 is at the low level, voltage V of transmission line TL becomes stable at the intersection L between output characteristic curve A2 at the low level and impedance characteristic curve B of the terminal resistance. In this case, negative current $I_L$ is sunk from transmission line TL to CMOS driver DRV1. That is, current $I_L$ flows from transmission line TL to output terminal T of driver DRV1.

Figure 5B:
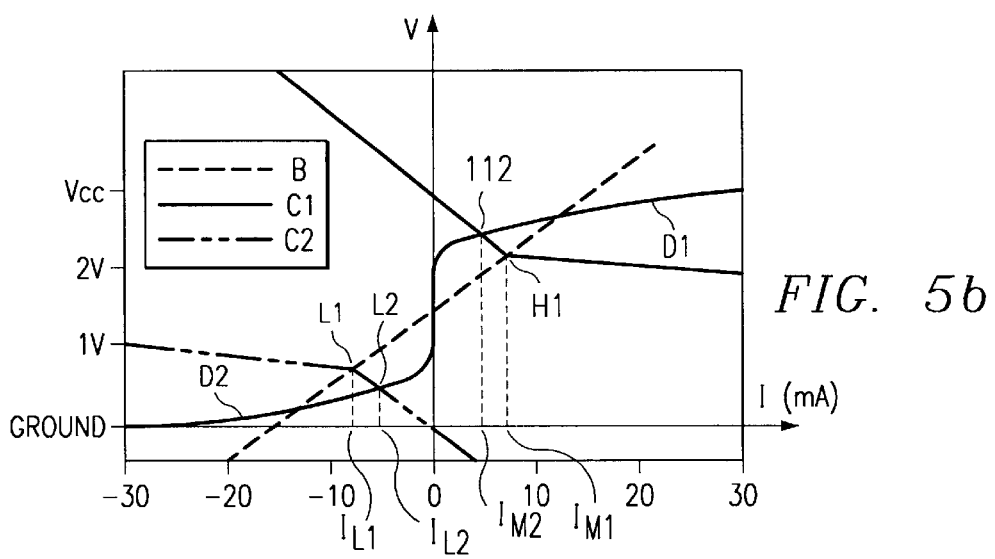

In FIG. 5(b), C1 and C2 illustrate the output impedance characteristics when the output of ULTTL driver DRV2 is at the high level and low level, respectively. D1 and D2 illustrate the clamp characteristics of the upper side (high level side) and lower side (low level side) of the clamping circuit, respectively. Also, broken line B illustrates the impedance characteristics when the same terminal resistance as that in FIG. [5](a) is used.

As shown in FIG. 5(b), when ULTTL driver DRV2 is used, its output impedance is switched between two levels corresponding to the output signal. For example, on the high level side, when the output signal voltage exceeds a prescribed level, the output impedance goes high. On the other hand, on the low level side, when the output signal voltage drops below a prescribed level, the output impedance goes higher. By reducing the output impedance of the driver that drives signal line TL it is possible to improve the effect in suppressing reflection of the transmission line. However, this is undesirable from the standpoint of power consumption. As shown in FIG. 5(b), by having 2 levels for the output impedance characteristics, it is possible to realize suppression of reflection and reduction of power consumption, the two contradictory objectives, at the same time.

For example, in the interface circuit using ULTTL driver DRV2 and terminal resistance, when the output of ULTTL driver DRV2 is at the high level, voltage V of transmission line TL is stable at intersection H1 of output impedance characteristic curve C1 at the high level and impedance characteristic curve B of the terminal resistance indicated by the broken line. In this case, current $I_{H1}$ is sourced from ULTTL driver DRV2 to transmission line TL.

On the other hand, when the output of ULTTL driver DRV2 is at the low level, voltage V of transmission line TL is stable at intersection L1 of output impedance characteristic curve C2 at the low level and impedance characteristic curve B of the terminal resistance indicated by the broken line. In this case, load current (input current) $I_{L1}$ flows from ULTTL driver DRV2 to transmission line TL.

When FIGS. 5(a) and (b) are compared, one has $I_{H1} < I_H$, $|I_{L1}| < |I_L|$. That is, the absolute value of current $I_{L1}$ is smaller than the absolute value of current $I_L$. For the same resistance terminal, when ULTTL driver DRV2 is used, the driving current of the driver is smaller and the power consumption is lower than the case when CMOS driver DRV1 is used.

In this case, as shown in FIG. 3, when an interface circuit using the clamping circuit is used in place of the terminal resistance, it is possible to further reduce the drive current of the driver. More specifically, as shown in FIG. 5(b), when the output of ULTTL driver DRV2 is at the high level, voltage V of transmission line TL becomes stable at intersection H2 of output impedance characteristic curve C1 at the high level and clamping characteristic curve D1 at the high level. In this case, current $I_{H2}$ is sourced from ULTTL driver DRV2 to transmission line TL.

On the other hand, when the output of ULTTL driver DRV2 is at the low level, voltage V of transmission line TL becomes stable at intersection L2 of output impedance characteristic curve C2 at the low level and clamping characteristic curve D2 at the low level. In this case, load current (input current) $I_{L2}$ is supplied from ULTTL driver DRV2 to transmission line TL.

As shown in the figure, one has $I_{H2} < I_{H1}$, $|I_{L2}| < |I_{L1}|$. That is, the absolute value of current $I_{L2}$ is smaller than the absolute value of current $I_{L1}$. In this way, when ULTTL driver DRV2 is used to drive transmission line TL, the configuration using the clamping circuit of the present invention has a smaller drive current and lower power consumption than the configuration using a resistive terminal. In addition, in the configuration using a resistive terminal, independent of the output signal level of ULTTL driver DRV2, a bias current always flows in the resistive elements. Consequently, wasteful power consumption takes place. When a clamping circuit is used, there is. no need to use resistive elements for the terminal, and it is thus possible to prevent power loss due to the bias current.

In the embodiment of the clamping circuit of the present invention explained above, the clamping circuit is composed of MOS transistors and diodes. However, the clamping circuit of the present invention is not limited to this configuration. For example, it may also be composed of bipolar transistors and diodes. As an example, the clamping circuit shown in FIG. 6 may be used.

As shown in the figure, in this example, npn transistor N1 is used in place of NMOS transistor NT1 shown in FIG. 1, and pnp transistor P1 is used in place of PMOS transistor PT1. In npn transistor N1, divider voltage $V_{ND1}$ of node ND1 is applied to its base, and the collector is connected to the feed line of power source voltage $V_{cc}$, while the emitter is connected to the anode of diode D1. In pnp transistor P1, divider voltage $V_{ND2}$ of node ND2 is applied to its base, and the collector is grounded, while the emitter is connected to the cathode of diode D2.

Figure 6:
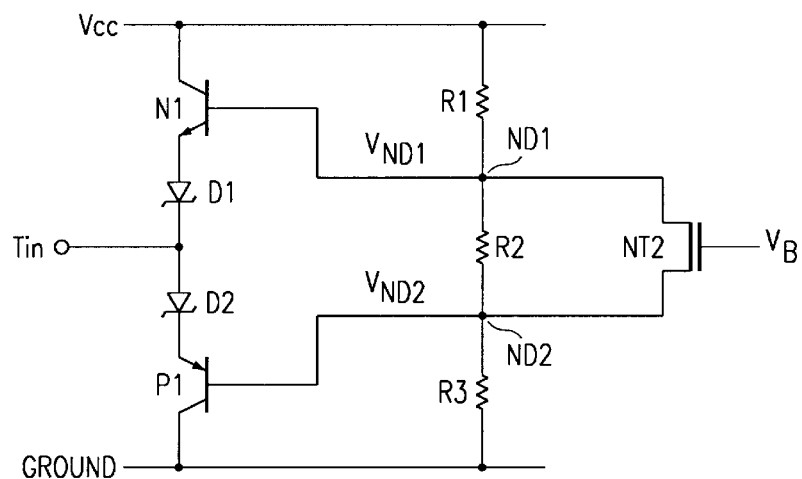
FIG. 6 is a circuit diagram illustrating another example of the clamping circuit of the present invention.
Figure 7:
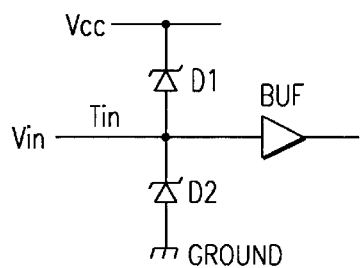
FIG. 7 is a circuit diagram illustrating an example of a conventional clamping circuit.
Figure 9:
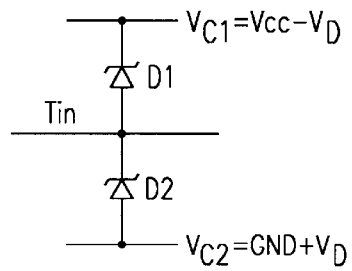
FIG. 9 is a circuit diagram illustrating another example of the clamping circuit of the present invention.
Figure 8:
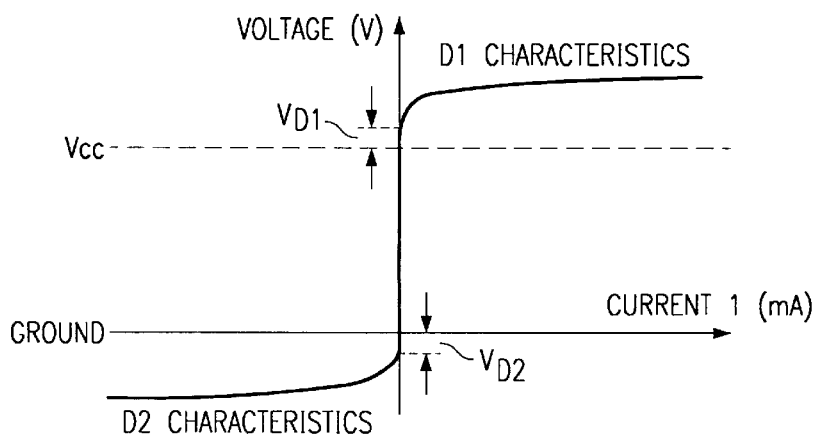
FIG. 8 is a diagram illustrating the clamping voltage range of the clamping circuit shown in FIG. 6.

If the voltage between the base and emitter of npn transistor N1 is $V_{ben}$, the voltage between the base and emitter of pnp transistor P1 is $V_{bep}$, and diodes D1, D2 and resistive elements R1, R2 and R3 for voltage division are the same as those used in the clamping circuit of FIG. 1, lower clamping voltage $V_{CL1}$ and upper clamping voltage $V_{CL2}$ of the clamping circuit shown in FIG. 6 become $(V_{ND1}-V_{ben}-V_{D1})$ and $(V_{ND2}+V_{bep}+V_{D2})$, respectively.

Also, it is possible to set two or more diode sections connected in tandem between the emitter of npn transistor N1 and input terminal $T_{in}$. Also, it is possible to set two or more diode sections connected in tandem between input terminal $T_{in}$ and the emitter of pnp transistor P1.

In the clamping circuit shown in FIG. 6, NMOS transistor NT2 for controlling voltages $V_{ND1}$ and $V_{ND2}$ of nodes ND1 and ND2 may be replaced with either an npn transistor or a pnp transistor.

Also, in FIG. 1, the connection relationship between transistor NT1 and diode D1 and the connection relationship between diode D2 and transistor PT1 may be respectively reversed. In this case, diodes D1 and D2 are respectively connected to power source voltage $V_{cc}$ and ground voltage GND, and transistors NT1 and PT1 are connected to input $T_{in}$.

As explained above, with the clamping circuit of the present invention, it is possible to simplify the circuit design and to reduce the power consumption. In addition, in the interface circuit using the clamping circuit of the present invention, by setting the clamping circuit on the input side of each buffer circuit, it is possible to omit the terminal resistance that is usually used as a terminal of the transmission line, and it is possible to prevent wasteful power loss due to the bias current of the terminal resistance.

What is claimed is:

1. A clamping circuit comprising:
   a first circuit containing a first transistor and a first diode electrically connected in series between the input terminal and the first voltage feed line,
   and a first voltage feed terminal for feeding the first voltage to the control terminal of said first transistor;
   a second circuit containing a second transistor and a second diode electrically connected in series between said input terminal and the second voltage feed line,
   and a second voltage feed terminal for feeding the second voltage to the control terminal of said second transistor;
   whereby when the voltage between said first voltage feed terminal and said input terminal or the voltage between said second voltage feed terminal and said input terminal reaches a prescribed level, said first or second transistor becomes conductive and the voltage of said input terminal is clamped;
   first, second and third resistive elements connected in series between said first voltage feed line and said second voltage feed line; the connection point between said first resistive element and said second resistive element forming said first voltage feed terminal; and the connection point between said second resistive element and said third resistive element forming said second voltage feed terminal;

wherein the cathode of said first diode is connected to said input terminal; said first transistor is connected between the anode of said further diode and said first voltage feed line; the anode of said second diode is connected to said input terminal; said second transistor is connected between the cathode of said second diode and said second voltage feed line; the power source voltage is fed to said first voltage feed line; and the ground voltage is fed to said second voltage feed line; and wherein a third transistor connected between said first voltage feed terminal and said second voltage feed terminal; whereby controlling the voltage applied to the control terminal of said third transistor, the voltages at said first and second voltage feed terminals are changed.

2. The clamping circuit described in claim 1, wherein said first and second circuits contain multiple diodes electrically connected in series.

3. The clamping circuit described in claim 1, wherein said first transistor is an n-channel MOS transistor, said second transistor is a p-channel MOS transistor, and said diodes are Schottky barrier diodes.

4. An interface circuit comprising:

a signal line, a driving circuit which has its output terminal connected to said signal line and is for driving said signal line to the prescribed voltage, an input circuit which has its input terminal connected to said signal line and operates in accordance with the voltage of said signal line, and a clamping circuit connected to the input terminal of said input circuit, where said clamping circuit is the clamping circuit described in claim 1.

5. The interface circuit described in claim 4 wherein the interface circuit has multiple input circuits connected to said signal line and multiple clamping circuits connected to the input terminals of said multiple input circuits, respectively.

6. An interface circuit comprising:

a signal line, a driving circuit which has its output terminal connected to said signal line and is for driving said signal line to the prescribed voltage, an input circuit which has its input terminal connected to said signal line and operates in accordance with the voltage of said signal line, and a clamping circuit connected to the input terminal of said input circuit, wherein said clamping circuit comprises:

a first circuit containing a first transistor and a first diode electrically connected in series between the input terminal and a first voltage feed line, a first voltage feed terminal for feeding the first voltage to the control terminal of said first transistor;

a second circuit containing a second transistor and a second diode electrically connected in series between said input terminal and a second voltage feed line, and a second voltage feed terminal for feeding the second voltage to the control terminal of said second transistor;

whereby when the voltage between said first voltage feed terminal and said input terminal or the voltage between said second voltage feed terminal and said input terminal reaches a prescribed level, said first or second transistor becomes conductive and the voltage of said input terminal is clamped.

7. The interface circuit described in claim 6 wherein the interface circuit has multiple input circuits connected to said signal line and multiple clamping circuits connected to the input terminals of said multiple input circuits, respectively.

8. The interface circuit described in claim 6 comprising: first, second and third resistive elements connected in series between said first voltage feed line and said second voltage feed line; the connection point between said first resistive element and said second resistive element forming said first voltage feed terminal; and the connection point between said second resistive element and said third resistive element forming said second voltage feed terminal.

9. The interface circuit described in claim 8 wherein: the cathode of said first diode is connected to said input terminal; said first transistor is connected between the anode of said first diode and said first voltage feed line; the anode of said second diode is connected to said input terminal; said second transistor is connected between the cathode of said second diode and said second voltage feed line; a power source voltage is fed to said first voltage feed line; and a ground voltage is fed to said second voltage feed line.

10. The interface circuit described in claim 9 wherein: a third transistor connected between said first voltage feed terminal and said second voltage feed terminal; whereby controlling voltage applied to the control terminal of said third transistor, the voltages at said first and second voltage feed terminals are changed.

* * * * *